United States Patent
Jeong

(10) Patent No.: US 9,048,368 B2
(45) Date of Patent: Jun. 2, 2015

(54) LIGHT EMITTING DEVICE

(71) Applicant: LG INNOTEK CO., LTD., Seoul (KR)

(72) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/017,625

(22) Filed: Sep. 4, 2013

(65) Prior Publication Data

US 2014/0061685 A1   Mar. 6, 2014

(30) Foreign Application Priority Data

Sep. 6, 2012 (KR) .................. 10-2012-0098713

(51) Int. Cl.
| | |
|---|---|
| H01L 29/18 | (2006.01) |
| H01L 33/08 | (2010.01) |
| H01L 27/15 | (2006.01) |
| H01L 25/075 | (2006.01) |
| H01L 33/00 | (2010.01) |
| H01L 33/22 | (2010.01) |
| H01L 33/38 | (2010.01) |
| H01L 33/40 | (2010.01) |
| H01L 33/44 | (2010.01) |
| H01L 33/62 | (2010.01) |

(52) U.S. Cl.
CPC .............. *H01L 33/08* (2013.01); *H01L 25/0753* (2013.01); *H01L 27/153* (2013.01); *H01L 33/0079* (2013.01); *H01L 33/22* (2013.01); *H01L 33/38* (2013.01); *H01L 33/385* (2013.01); *H01L 33/405* (2013.01); *H01L 33/44* (2013.01); *H01L 33/62* (2013.01); *H01L 2224/48091* (2013.01)

(58) Field of Classification Search
CPC . H01L 33/08; H01L 25/0753; H01L 33/0079; H01L 33/22; H01L 33/38; H01L 2224/48091; H01L 33/44; H01L 2924/00014
USPC ................. 257/13, 79, 88, 94, 98, 99, 100, 257/E51.022, E33.001, E51.026
See application file for complete search history.

(56) References Cited

U.S. PATENT DOCUMENTS

| 6,504,180 | B1 * | 1/2003 | Heremans et al. ............. 257/98 |
|---|---|---|---|
| 8,653,542 | B2 * | 2/2014 | Hsia et al. ...................... 257/88 |
| 2011/0089450 | A1 * | 4/2011 | Jeong et al. .................... 257/98 |
| 2011/0133242 | A1 * | 6/2011 | Choi et al. ...................... 257/99 |
| 2011/0193058 | A1 * | 8/2011 | Moon et al. .................... 257/13 |
| 2011/0193121 | A1 * | 8/2011 | Jeong .............................. 257/98 |
| 2011/0220937 | A1 * | 9/2011 | Jeong et al. .................... 257/98 |
| 2011/0297972 | A1 * | 12/2011 | Seo et al. ........................ 257/88 |
| 2012/0049226 | A1 * | 3/2012 | Jeong .............................. 257/98 |

(Continued)

*Primary Examiner* — Cuong Q Nguyen
*Assistant Examiner* — Yosef Gebreyesus
(74) *Attorney, Agent, or Firm* — Ked & Associates, LLP

(57) ABSTRACT

A light emitting device includes a conductive support member, and first and second light emitting structures. A channel layer is provided around lower portions of the first and second light emitting structures. A first electrode is coupled to a first conductive first semiconductor layer of the first light emitting structure, and a second electrode is coupled to a second semiconductor layer of the first light emitting structure. A third electrode is coupled to a third semiconductor layer of the second light emitting structure, and a fourth electrode is coupled to a fourth semiconductor layer of the second light emitting structure. A first connection part is coupled to the first electrode and the conductive support member, and a second connection part is coupled to the second and third electrodes. A third connection part is coupled to the fourth electrode and has one end provided on the channel layer.

20 Claims, 13 Drawing Sheets

(56) References Cited

U.S. PATENT DOCUMENTS

| | | | |
|---|---|---|---|
| 2013/0049038 A1* | 2/2013 | Jeong | 257/91 |
| 2014/0048839 A1* | 2/2014 | Jeong et al. | 257/99 |
| 2014/0145222 A1* | 5/2014 | Yang et al. | 257/93 |

* cited by examiner

LIGHT EMITTING DEVICE

CROSS-REFERENCE TO RELATED APPLICATIONS

The present application claims priority under 35 U.S.C. 119 to Korean Patent Application No. 10-2012-0098713 filed on Sep. 6, 2012, which is hereby incorporated by reference in its entirety.

BACKGROUND

The embodiment relates to a light emitting device, a light emitting device package, and a light unit.

A light emitting diode (LED) has been extensively used as one of light emitting devices. The LED converts electrical signals into the form of light such as infra-red light, ultraviolet light, and visible light by using the characteristic of a compound semiconductor.

As the light efficiency of the light emitting device is increased, the LED has been used in various fields such as display apparatuses and lighting appliances.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
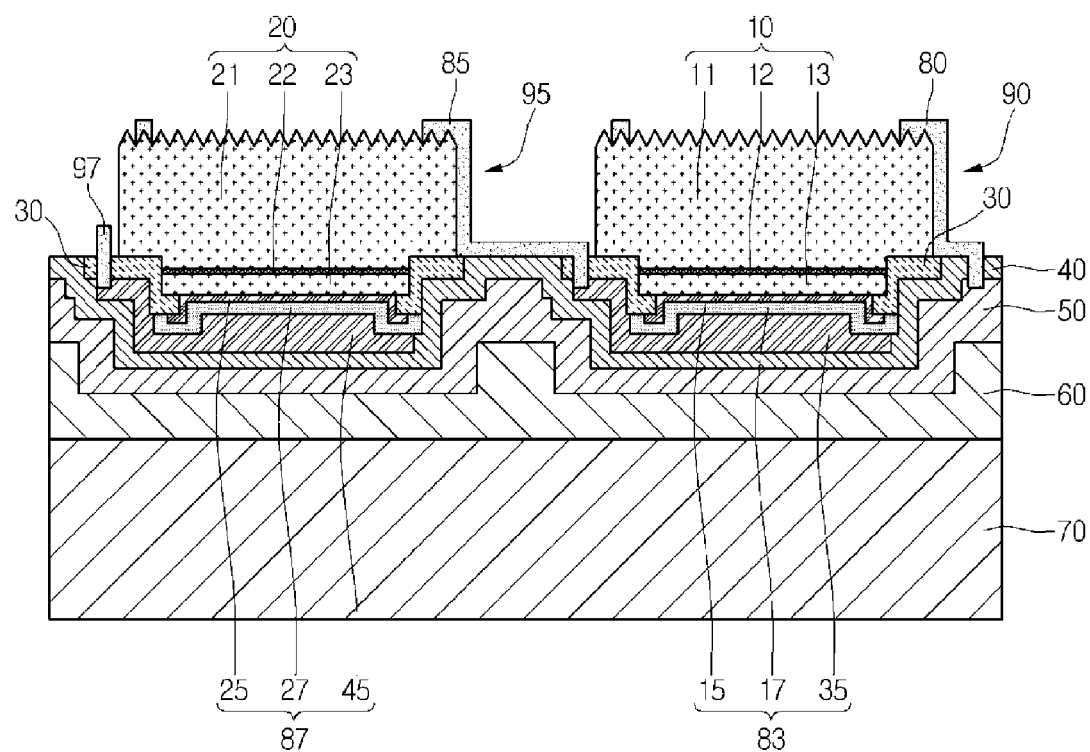
FIG. 1 is a view showing a light emitting device according to the embodiment.

In the description of the embodiments, it will be understood that when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit, and a method for fabricating the light emitting device according to the embodiments will be described in detail with reference to accompanying drawings.

FIG. 1 is a view showing a light emitting device according to the embodiment.

As shown in FIG. 1, the light emitting device according to the embodiment may comprise a first light emitting structure 10, a second light emitting structure 20, first to fourth electrodes 80, 83, 85 and 87, and a conductive support member 70.

Although it is shown in FIG. 1 as one example that the first and second a first light emitting structures 10 and 20 are provided over the conductive support member 70, three light emitting structures or more may be provided over the conductive support member 70. The light emitting structures may be electrically connected to each other. For example, light emitting structures may be electrically connected in series to each other.

The first light emitting structure 10 may comprise a first conductive first semiconductor layer 11, a first active layer 12, and a second conductive second semiconductor layer 13. The first active layer 12 may be disposed between the first conductive first semiconductor layer 11 and the second conductive second semiconductor layer 13. The first active layer 12 may be provided under the first conductive first semiconductor layer 11, and the second conductive second semiconductor layer 13 may be provided under the first active layer 12.

The first conductive first semiconductor layer 11 may comprise an N-type semiconductor layer doped with N-type dopants serving as first conductive dopants, and the second conductive second semiconductor layer 13 may comprise a P-type semiconductor layer doped with P-type dopants serving as second conductive dopants. In addition, the first conductive first semiconductor layer 11 may comprise a P-type semiconductor layer, and the second conductive second semiconductor layer 13 may comprise an N-type semiconductor layer.

For example, the first conductive first semiconductor layer 11 may comprise an N-type semiconductor layer. The first conductive first semiconductor layer 11 may be implemented by using a compound semiconductor. The first conductive first semiconductor layer 11 may be implemented by using a group II-VI compound semiconductor, or a group III-V compound semiconductor.

For example, the first conductive first semiconductor layer 11 may be implemented by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive first semiconductor layer 11 may comprise one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The first active layer 12 emits light having a wavelength corresponding to the energy band gap difference according to materials constituting the active layer 13 through the combination of electrons (or holes) injected through the first conductive first semiconductor layer 11 and holes (or electrons) injected through the second conductive second semiconductor layer 13. The first active layer 12 may have one of a single quantum well (SQW) structure, a multi-quantum well (MQW) structure, a quantum dot structure, and a quantum wire structure, but the embodiment is not limited thereto.

For example, the first active layer 12 may be implemented by using a compound semiconductor. The first active layer 12 may be implemented by using a semiconductor material having a compositional formula of $In_xAl_yGa_{1-x-y}N$ ($0 \leq x \leq 1$, $0 \leq y \leq 1$, $0 \leq x+y \leq 1$). When the first active layer 12 has an MQW structure, the first active layer 12 may be formed by stacking a plurality of well layers and a plurality of barrier layers. For example, the first active layer 12 may have a cycle of InGaN well layer/GaN barrier layer.

For example, the second conductive second semiconductor layer 13 may comprise a P-type semiconductor layer. The second conductive second semiconductor layer 13 may be implemented by using a compound semiconductor. For example, the second conductive second semiconductor layer 13 may be implemented by using a group II-VI compound semiconductor, or a group II-V compound semiconductor.

For example, the second conductive second semiconductor layer 13 may be implemented by using a semiconductor material having a compositional formula of $In_xAl_yGa_{1-x-y}N$ ($0 \le x \le 1$, $0 \le y \le 1$, $0 \le x+y \le 1$). For example, the second conductive second semiconductor layer 13 may comprise one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive first semiconductor layer 11 may comprise a P-type semiconductor layer and the second conductive second semiconductor layer 13 may comprise the N-type semiconductor layer. In addition, a semiconductor layer comprising an N-type or P-type semiconductor layer may be additionally provided under the second conductive second semiconductor layer 13. Accordingly, the first light emitting structure 10 may have at least one of an NP junction structure, a PN junction structure, an NPN junction structure, or a PNP junction structure. In addition, impurities may be doped into the first conductive first semiconductor layer 11 and the second conductive second semiconductor layer 13 with uniform or non-uniform doping concentration. In other words, the first light emitting structure 10 may have various structures, but the embodiment is not limited thereto.

In addition, a first conductive InGaN/GaN superlattice structure or InGaN/InGaN superlattice structure may be formed between the first conductive first semiconductor layer 11 and the first active layer 12. In addition, a second conductive AlGaN layer may be formed between the second conductive second semiconductor layer 13 and the first active layer 13.

The second light emitting structure 20 may comprise a first conductive third semiconductor layer 21, a second active layer 22, and a second conductive fourth semiconductor layer 23. The second active layer 22 may be disposed between the first conductive third semiconductor layer 21 and the second conductive fourth semiconductor layer 23. The second active layer 22 may be provided under the first conductive third semiconductor layer 21, and the second conductive fourth semiconductor layer 23 may be provided under the second active layer 22.

The configuration and composition of the second light emitting structure 20 may be similar to those of the first light emitting structure 10.

The light emitting device according to the embodiment may comprise a channel layer 30 provided at peripheral portions of lower portions of the first and second light emitting structure 10 and 20. For example, a top surface of the channel layer 30 may be provided higher than a top surface of the first active layer 12. The top surface of the channel layer 30 may be provided higher than a top surface of the second active layer 22.

The channel layer 30 may surround the first active layer 12. The channel layer 30 may surround a peripheral portion of the second conductive second semiconductor layer 13. One end of the channel layer 30 may be provided under the second conductive second semiconductor layer 13. The one end of the channel layer 30 may make contact with a bottom surface of the second conductive second semiconductor layer 13. The one end of the channel layer 30 may be disposed between the second conductive second semiconductor layer 13 and the second electrode 83. The one end of the channel layer 30 may be disposed between the second conductive second semiconductor layer 13 and a first reflective layer 17.

The channel layer 30 may surround the second active layer 22. The channel layer 30 may surround a peripheral portion of the second conductive fourth semiconductor layer 23. One end of the channel layer 30 may be provided under the second conductive fourth semiconductor layer 23. The one end of the channel layer 30 may make contact with a bottom surface of the second conductive fourth semiconductor layer 23. The one end of the channel layer 30 may be disposed between the second conductive fourth semiconductor layer 23 and the fourth electrode 87. The one end of the channel layer 30 may be disposed between the second conductive fourth semiconductor layer 23 and a second reflective layer 27.

For example, the channel layer 30 may be implemented by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the first and second light emitting structures 10 and 20 thereafter. In addition, through the isolation process, the electrical characteristic of the light emitting device can be prevented from being degraded.

The first electrode 80 may be electrically connected to the first conductive first semiconductor layer 11. The first electrode 80 may be provided on the first conductive first semiconductor layer 11. The first electrode 80 may make contact with the first conductive first semiconductor layer 11. The first reflective layer 17 may be electrically connected to the second conductive second semiconductor layer 13. The first reflective layer 17 may be provided under the first light emitting structure 10. The first reflective layer 17 may be provided under the second conductive second semiconductor layer 13.

The light emitting device according to the embodiment may comprise the first ohmic contact layer 15 disposed between the first reflective layer 17 and the second conductive second semiconductor layer 13. The first ohmic contact layer 15 may make contact with the second conductive second semiconductor layer 13.

The first ohmic contact layer 15 may make ohmic contact with the first light emitting structure 10. The first ohmic contact layer 15 may comprise a region making ohmic contact with the first light emitting structure 10. The first reflective layer 17 may be electrically connected to the second conductive second semiconductor layer 13. In addition, the first reflective layer 17 reflects light incident thereto from the first light emitting structure 10 to increase the quantity of light extracted to an outside.

For example, the first ohmic contact layer 15 may comprise a transparent conductive oxide layer. For example, the first ohmic contact layer 15 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The first reflective layer 17 may comprise a material having high reflectance. For example, the first reflective layer 17 may comprise metal comprising at least one of Ag, Ni, Al, Rh, Pd, Ir, Ru, Mg, Zn, Pt, Cu, Au, and Hf, and the alloy thereof. In addition, the first reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the first reflective layer 17 may comprise at least one of Ag, Al, an Ag—Pd—Cu alloy, and an Ag—Cu alloy.

For example, the first reflective layer 17 may have a structure in which an Ag layer and a Ni layer are alternately formed, and may comprise Ni/Ag/Ni or a TI layer, and a Pt layer. In addition, the first ohmic contact layer 15 may be provided under the first reflective layer 17, and at least a portion of the first ohmic contact layer 15 may make ohmic contact with the first light emitting structure 10 through the first reflective layer 17.

The light emitting device according to the embodiment may comprise a first metal layer 35 provided under the first reflective layer 17. The first metal layer 35 may comprise at least one of Au, Cu, Ni, Ti, Ti—W, Cr, W, Pt, V, Fe, and Mo.

According to the embodiment, the second electrode 83 may comprise at least one of the first reflective layer 17, the first ohmic contact layer 15, and the first metal layer 35. For example, the second electrode 83 may comprise all of the first reflective layer 17, the first metal layer 35 and the first ohmic contact layer 15 or may selectively comprise one or two of the first reflective layer 17, the first metal layer 35 and the first ohmic contact layer 15. A lamination sequence of the first reflective layer 17, the first metal layer 35 and the first ohmic contact layer 15 constituting the second electrode 83 may vary.

The third electrode 85 may be electrically connected to the first conductive third semiconductor layer 21. The third electrode 85 may be provided on the first conductive third semiconductor layer 21. The third electrode 85 may make contact with the first conductive third semiconductor layer 21. The second reflective layer 27 may be electrically connected to the second conductive fourth semiconductor layer 23. The second reflective layer 27 may be provided under the second light emitting structure 20. The second reflective layer 27 may be provided under the second conductive fourth semiconductor layer 23.

The light emitting device according to the embodiment may comprise the second ohmic contact layer 25 disposed between the second reflective layer 27 and the second conductive fourth semiconductor layer 23. The second ohmic contact layer 25 may make contact with the second conductive fourth semiconductor layer 23.

The second ohmic contact layer 25 may make ohmic contact with the second light emitting structure 20. The second ohmic contact layer 25 may comprise a region making ohmic contact with the second light emitting structure 20. The second reflective layer 27 may be electrically connected to the second conductive fourth semiconductor layer 23. In addition, the second reflective layer 27 reflects light incident thereto from the second light emitting structure 20 to increase the quantity of light extracted to an outside.

For example, the second ohmic contact layer 25 may comprise a transparent conductive oxide layer. For example, the second ohmic contact layer 25 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The second reflective layer 27 may comprise a material having high reflectance. For example, the second reflective layer 27 may comprise metal comprising at least one of Ag, Ni, Al, Rh, Pd, Ir, Ru, Mg, Zn, Pt, Cu, Au, and Hf, and the alloy thereof. In addition, the second reflective layer 27 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the second reflective layer 27 may comprise at least one of Ag, Al, an Ag—Pd—Cu alloy, and an Ag—Cu alloy.

For example, the second reflective layer 27 may have a structure in which an Ag layer and a Ni layer are alternately formed, and may comprise Ni/Ag/Ni or a TI layer, and a Pt layer. In addition, the second ohmic contact layer 25 may be provided under the second reflective layer 27, and at least a portion of the second ohmic contact layer 25 may make ohmic contact with the second light emitting structure 20 through the second reflective layer 27.

The light emitting device according to the embodiment may comprise a second metal layer 45 provided under the second reflective layer 27. The second metal layer 45 may comprise at least one of Au, Cu, Ni, Ti, Ti—W, Cr, W, Pt, V, Fe, and Mo.

According to the embodiment, the fourth electrode 87 may comprise at least one of the second reflective layer 27, the second ohmic contact layer 25, and the second metal layer 45. For example, the fourth electrode 87 may comprise all of the second reflective layer 27, the second metal layer 45 and the second ohmic contact layer 25 or may selectively comprise one or two of the second reflective layer 27, the second metal layer 45 and the second ohmic contact layer 25. A lamination sequence of the second reflective layer 27, the second ohmic contact layer 25 and the second metal layer 45 constituting the fourth electrode 87 may vary.

The light emitting device according to the embodiment may comprise a third metal layers 50 provided under the first metal layer 35. The third metal layer 50 may be provided under the second metal layer 45.

The third metal layer 50 may comprise at least one of Cu, Ni, Ti, Ti—W, Cr, W, Pt, V, Fe, and Mo. The third metal layer 50 may serve as a diffusion barrier layer. A first bonding layer 60 and the conductive support member 70 may be provided under the third metal layer 50.

The third metal layers 50 may prevent a material included in the bonding layer 60 from being diffused to the first and second reflective layers 17 and 27 in the process of providing the bonding layer 60. The third metal layer 50 may prevent a material, such as zinc (Sn), included in the bonding layer 60 from exerting an influence on the first and second reflective layers 17 and 27.

The bonding layer 60 may comprise barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the first and second light emitting structures 10 and 20 according to the embodiment while performing a heat radiation function. The bonding layer 60 may be implemented in the form of a seed layer.

For example, the conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, power may be applied to the first light emitting structure 10 through the first and second electrodes 80 and 83. According to the embodiment, the first electrode 80 may comprise an ohmic layer, an intermediate layer and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

A roughness may be formed on the top surface of the first conductive first semiconductor layer 11. Accordingly, the quantity of light extracted upward at the region where the roughness is formed can be increased.

According to the embodiment, an electric power may be applied to the second light emitting structure 20 through the third and fourth electrodes 85 and 87. According to the embodiment, the third electrode 85 may comprise an ohmic layer, an intermediate layer, and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The third electrode 85 may comprise at least one selected from the group consisting of Cr, V, W, Ti, Zn, Ni, Cu, Al, Au and Mo.

A roughness may be formed on the top surface of the first conductive third semiconductor layer 21. Accordingly, the quantity of light extracted upward at the region where the roughness is formed can be increased.

The light emitting device according to the embodiment may comprise an insulating layers 40 disposed between the first metal layer 35 and the third metal layer 50. The insulating layer 40 may insulate the first metal layer 35 from the third metal layer 50. The insulating layer 40 may insulate the first metal layer 35 from the conductive support member 70. For example, the insulating layer 40 may be implemented by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the first reflective layer 17. The top surface of the insulating layer 40 may be exposed to a peripheral portion of the lower portion of the first light emitting structure 10. The insulating layer 40 may surround a peripheral portion of the channel layer 30.

The light emitting device according to the embodiment may comprise the insulating layer 40 disposed between the second and third metal layers 45 and 50. The insulating layer 40 may insulate the second and third metal layers 45 and 50 from each other. The insulating layer 40 may insulate the second metal layer 45 and the conductive support member 70 from each other. The insulating layer 40 may be disposed between the first and second metal layers 35 and 45. The insulating layer 40 may insulate the first and second metal layers 35 and 45 from each other.

The insulating layer 40 may surround a peripheral portion of the second metal layer 45. A portion of the insulating layer 40 may make contact with the lateral side of the second reflective layer 27. The top surface of the insulating layer 40 may be exposed to a peripheral portion of the lower portion of the second light emitting structure 20. The insulating layer 40 may surround a peripheral portion of the channel layer 30.

The light emitting device according to the embodiment may comprise first to third connection parts 90, 95 and 97. The first connection part 90 may be electrically connected to the first electrode 80 and the conductive support member 70. The second connection part 95 may be electrically connected to the second and third electrodes 83 and 85. The third connection part 97 may be electrically connected to the fourth electrodes 87. One end of the third connection part 97 may be provided over the channel layer 30. The third connection part 97 may be electrically connected to the second reflective layer 27.

The first connection part 90 may make contact with the first electrode 80. The first connection part 90 may be electrically connected to the third metal layer 50. The first connection part 90 may make contact with the third metal layer 50. The first connection part 90 may be electrically connected to the conductive support member 70 through the third metal layer 50 and the bonding layer 60. The first connection part 90 may make direct contact with the bonding layer 60 or the conductive support member 70.

The first connection part 90 may be provided through the insulating layer 40. The first connection part 90 may be electrically connected to the conductive support member 70 through the insulating layer 40. In addition, the first connection part 90 may be electrically connected to the third metal layer 50 through the channel layer 30. The first connection part 90 may be electrically connected to the third metal layer 50 through the channel layer 30 and the insulating layer 40.

The first connection part 90 may be provided at a lateral side of the first light emitting structure 10. The first connection part 90 may be provided at a lateral side of the first conductive first semiconductor layer 11. The first connection part 90 may make contact with the lateral side of the first conductive first semiconductor layer 11. The channel layer 30 may insulate the first connection part 90 from the first active layer 12. The channel layer 30 may insulate the first connection part 90 from the second conductive second semiconductor layer 13. The first connection part 90 may be spaced apart from the first active layer 12 by at least 3 μm.

The second connection part 95 may be provided at a lateral side of the second light emitting structure 20. The second connection part 95 may be provided at a lateral side of the first conductive third semiconductor layer 21. The second connection part 95 may make contact with the lateral side of the first conductive third semiconductor layer 21. The channel layer 30 may insulate the second connection part 95 from the second active layer 22. The channel layer 30 may insulate the second connection part 95 from the second conductive fourth semiconductor layer 23. The second connection part 95 may be spaced apart from the second active layer 22 by at least 3 μm.

The third connection part 97 may be electrically connected to the second metal layer 45. The third connection part 97 may make contact with the second metal layer 45. One end of the third connection part 97 may be provided on the channel layer 30. One end of the third connection part 97 may be spaced apart from a lateral side of the second light emitting structure 20. One end of the third connection part 97 may be exposed to the lateral side of the second light emitting structure 20.

The third connection part 97 may be electrically connected to the second metal layer 45 through the channel layer 30. In addition, the third connection part 97 may be electrically connected to the second metal layer 45 through the insulation layer 40. The third connection part 97 may be electrically connected to the fourth electrode 87. The third connection part 97 may make contact with the fourth electrode 87.

The first to third connection parts 90, 95 and 97 may comprise at least one of Cr, V, W, Ti, Zn, Ni, Pt, Cu, Al, Au and Mo.

According to the light emitting device of the embodiment, the second electrode 83 may be electrically connected to the first conductive first semiconductor layer 11 provided on the second electrode 83 through the conductive support member 70 provided under the second electrode 83. The second electrode 83 may be disposed between the second conductive second semiconductor layer 13 and the conductive support member 70.

Thus, an electric power may be provided to the first conductive first semiconductor layer 11 through a scheme of attaching the conductive support member 70 to a bonding pad. In addition, according to the embodiment, the second connection part 95 may be electrically connected to the second and third electrodes 83 and 85. The third connection part 97 may be electrically connected to the fourth electrode 87. Thus, by connecting the third connection part 97 to a power pad through a wire bonding scheme, an electric power may be supplied to the second conductive second semiconductor layer 13.

According to the light emitting device of the embodiment, an electric power may be supplied to the first and second light emitting structures 10 and 20 through the conductive support member 70 and the third connection part 97. Therefore, according to the embodiment, current concentration can be prevented, and the electrical reliability can be improved.

Hereinafter, a method of fabricating the light emitting device according to the embodiment will be described with reference to FIGS. 2 to 6.

Figure 2:
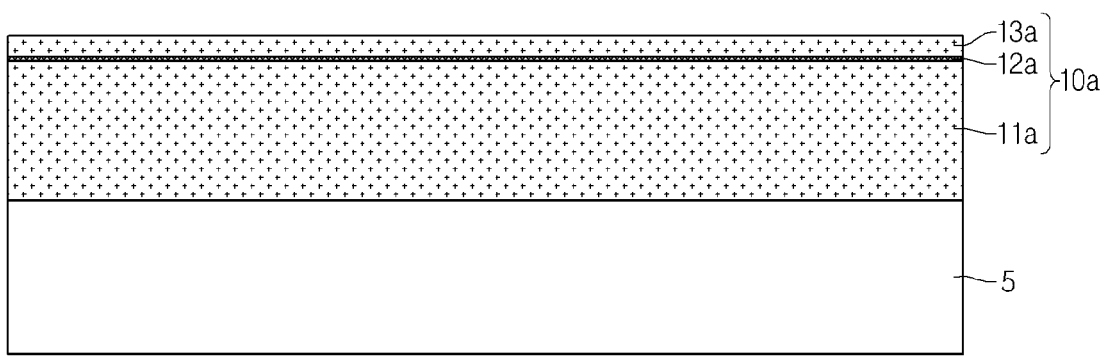
FIGS. 2 to 6 are sectional views showing a method of fabricating a light emitting device according to the embodiment.

According to the method of fabricating the light emitting device of the embodiment, as shown in FIG. 2, the first conductive semiconductor layer 11a, the active layer 12a, and the second conductive semiconductor layer 13a may be formed on a substrate 5. The first conductive semiconductor layer 11a, the active layer 12a, and the second conductive semiconductor layer 13a may be defined as the light emitting structure 10a.

For example, the substrate 5 may comprise at least one of a sapphire substrate ($Al_2O_3$), SiC, GaAs, GaN, ZnO, Si, GaP, InP, and Ge, but the embodiment is not limited thereto. A buffer layer may be disposed between the first conductive semiconductor layer 11a and the substrate 5.

The first conductive semiconductor layer 11a may comprise an N-type semiconductor layer doped with N-type dopants serving as first conductive dopants, and the second conductive semiconductor layer 13a may comprise a P-type semiconductor layer doped with P-type dopants serving as second conductive dopants. In addition, the first conductive semiconductor layer 11a may comprise a P-type semiconductor layer, and the second conductive semiconductor layer 13a may comprise an N-type semiconductor layer.

For example, the first conductive semiconductor layer 11a may comprise an N-type semiconductor. The first conductive semiconductor layer 11a may comprise a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11a may comprise one selected from the group consisting of InAlGaN, GaN, AlGaN, AlInN, InGaN, AlN, and InN, and may be doped with N-type dopants such as Si, Ge, Sn, Se, and Te.

The active layer 12a emits light having a wavelength corresponding to the energy band gap difference according to materials constituting the active layer 12a through the combination of electrons (or holes) injected through the first conductive semiconductor layer 11a and holes (or electrons) injected through the second conductive semiconductor layer 13a. The active layer 12a may have one of a single quantum well (SQW) structure, a multi-quantum well (MQW) structure, a quantum dot structure, and a quantum wire structure, but the embodiment is not limited thereto.

The active layer 12a may be implemented by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12a has an MQW structure, the active layer 12a may be formed by stacking a plurality of well layers and a plurality of barrier layers. For example, the active layer 12a may have a cycle of InGaN well layer/GaN barrier layer.

For example, the second conductive semiconductor layer 13a may be implemented by using a P type semiconductor. The second conductive semiconductor layer 13a may be implemented by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13a may comprise one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11a may comprise a P-type semiconductor layer and the second conductive semiconductor layer 13a may comprise the N-type semiconductor layer. In addition, a semiconductor layer comprising an N-type or P-type semiconductor layer may be additionally provided on the second conductive semiconductor layer 13a. Accordingly, the light emitting structure 10a may have at least one of an NP junction structure, a PN junction structure, an NPN junction structure, or a PNP junction structure. In addition, impurities may be doped into the first conductive semiconductor layer 11a and the second conductive semiconductor layer 13a with uniform or non-uniform doping concentration. In other words, the light emitting structure 10a may have various structures, but the embodiment is not limited thereto.

In addition, the first conductive InGaN/GaN superlattice structure or InGaN/InGaN superlattice structure may be formed between the first conductive semiconductor layer 11a and the active layer 12a. In addition, a second conductive AlGaN layer may be formed between the second conductive semiconductor layer 13a and the active layer 12a.

Figure 3:
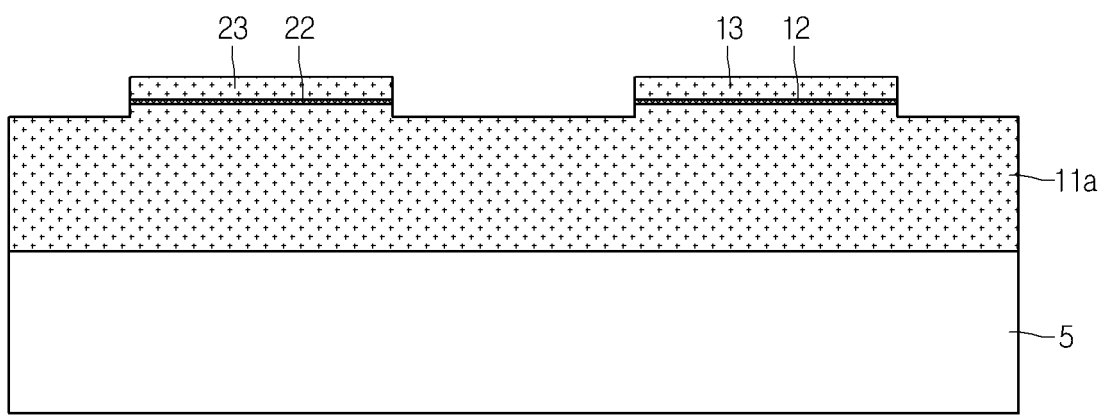

Next, as shown in FIG. 3, a portion of the first conductive semiconductor layer 11a may be exposed by performing an etching scheme for the light emitting structure 10a. In this case, the etching may comprise a wet etching scheme or a dry etching scheme. In this case, the first active layer 12 and the second conductive second semiconductor layer 13 constitutes the first light emitting structure later, and the second active layer 22 and the second conductive fourth semiconductor layer 23 constitutes the second light emitting structure later.

Figure 4:
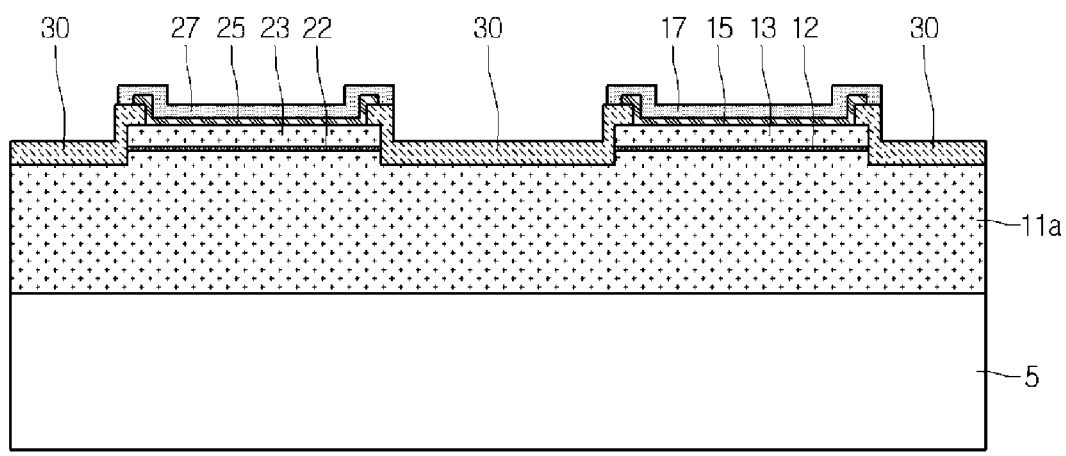

Next, as shown in FIG. 4, the channel layer 30, the first and second ohmic contact layers 15 and 25, and the first and second reflective layers 17 and 27 may be formed.

For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The first ohmic contact layer 15 may be disposed between the first reflective layer 17 and the second conductive second semiconductor layer 13. The first ohmic contact layer 15 may make contact with the second conductive second semiconductor layer 13. The first reflective layer 17 may be electrically connected to the second conductive second semiconductor layer 13. The first ohmic contact layer 15 may comprise a region making ohmic contact with the second conductive second semiconductor layer 13.

The second ohmic contact layer 25 may be disposed between the second reflective layer 27 and the second conductive fourth semiconductor layer 23. The second ohmic contact layer 25 may make contact with the second conductive fourth semiconductor layer 23. The second reflective layer 27 may be electrically connected to the second conductive fourth semiconductor layer 23. The second ohmic contact layer 25 may comprise a region making ohmic contact with the second conductive fourth semiconductor layer 23.

For example, the first and second ohmic contact layers 15 and 25 may comprise a transparent conductive oxide layer. For example, the first and second ohmic contact layer 15 and 25 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The first and second reflective layers 17 and 27 may comprise a material having high reflectance. For example, the first and second reflective layers 17 and 27 may comprise metal comprising at least one of Ag, Ni, Al, Rh, Pd, Ir, Ru, Mg, Zn, Pt, Cu, Au, and Hf, and the alloy thereof. In addition, the first and second reflective layers 17 and 27 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the first and second reflective layers 17 and 27 may comprise at least one of Ag, Al, an Ag—Pd—Cu alloy, and an Ag—Cu alloy. For example, the first and second reflective layers 17 and 27 may have a structure in which an Ag layer and a Ni layer are alternately formed, and may comprise Ni/Ag/Ni or a Ti layer, and a Pt layer.

Figure 5:
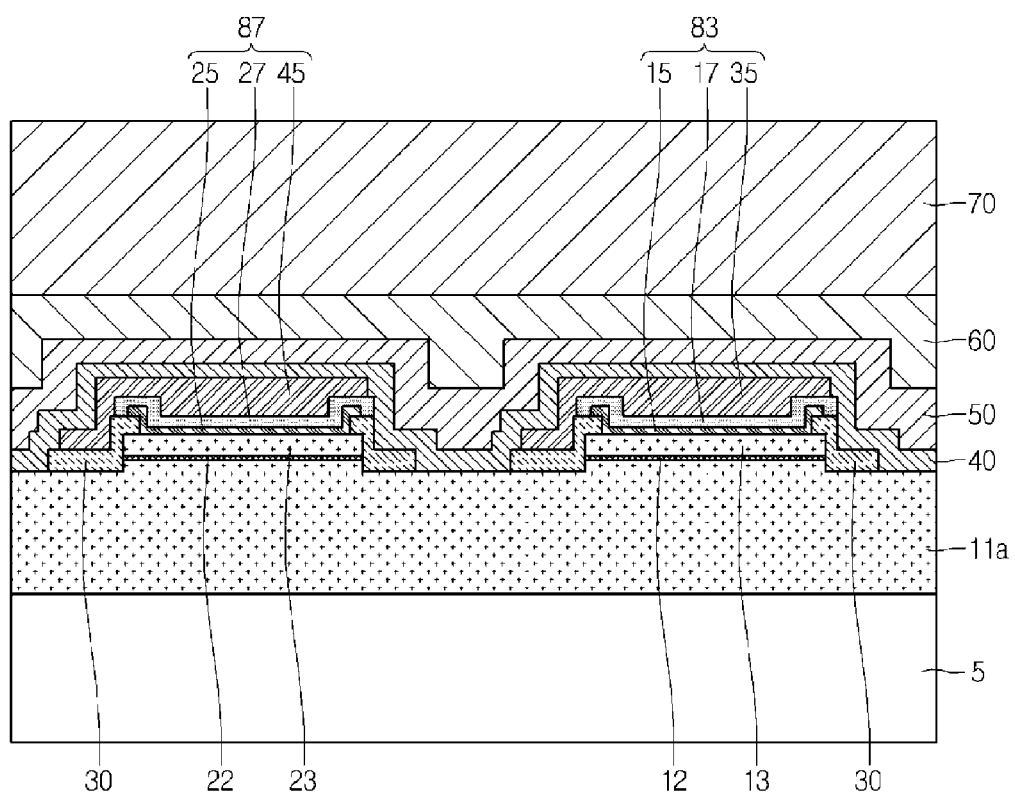

As shown in FIG. 5, the first metal layer 35 is formed on the first reflective layer 17, and the second metal layer 45 is formed on the second reflective layer 27. Then, the insulating layer 40, the third metal layer 50, the bonding layers 60, and the conductive support member 70 may be formed on the first and second reflective layers 35 and 45.

The first and second metal layers 35 and 45 may comprise at least one selected from the group consisting of Au, Cu, Ni, Ti, Ti—W, Cr, W, Pt, V, Fe, and Mo.

According to the embodiment, the second electrode 83 may comprise at least one of the first reflective layer 17, the first ohmic contact layer 15, and the first metal layer 35. The fourth electrode 87 may comprise at least one of the second reflective layer 27, the second ohmic contact layer 25, and the second metal layer 45.

The insulating layer 40 may insulate the first metal layer 35 from the third metal layer 50. The insulating layer 40 may insulate the first metal layer 35 from the conductive support member 70. The insulating layer 40 may insulate the second metal layer 45 from the third metal layer 50. The insulating layer 40 may insulate the second metal layer 45 from the conductive support member 70. The insulating layer 40 may insulate the first metal layer 35 from the second metal layer 45.

For example, the insulating layer 40 may be implemented by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with a lateral side of the first reflective layer 17. The insulating layer 40 may surround a peripheral portion of the channel layer 30. The insulating layer 40 may surround a peripheral portion of the second metal layer 45. A portion of the insulating layer 40 may make contact with a lateral side of the second reflective layer 27.

The third metal layer 50 may comprise at least one of Cu, Ni, Ti, Ti—W, Cr, W, Pt, V, Fe, and Mo. The third metal layer 50 may serve as a diffusion barrier layer.

The third metal layer 50 may prevent a material included in the bonding layer 60 from being diffused to the first and second reflective layers 17 and 27 in the process of providing the bonding layer 60. The third metal layer 50 may prevent a material, such as zinc (Sn), included in the bonding layer 60 from exerting an influence on the first and second reflective layers 17 and 27.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure according to the embodiment while performing a heat radiation function. The bonding layer 60 may be implemented in the form of a seed layer.

For example, the conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

Next, the substrate 5 is removed from the first conductive semiconductor layer 11*a*. According to one example, the substrate 5 may be removed through a laser lift off (LLO) process. The LLO process is a process to laminate the substrate 5 from the first conductive semiconductor layer 11*a* by irradiating a laser to the bottom surface of the substrate 5.

Figure 6:
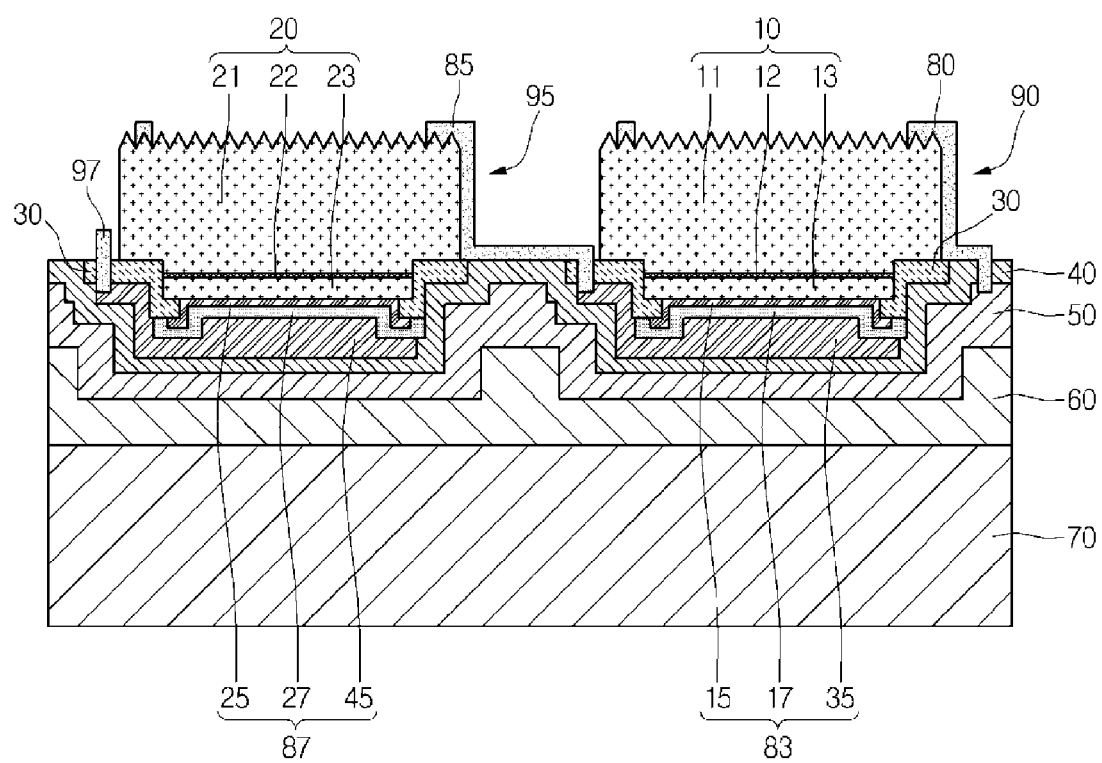

In addition, as shown in FIG. 6, the lateral sides of the first and second light emitting structures 10 and 20 are etched through an isolation etching process to expose a portion of the channel layer 30. In this case, a portion of the insulating layer 40 may be exposed. The isolation etching process may be performed through a dry etching process such as inductively coupled plasma (ICP), but the embodiment is not limited thereto.

The roughness may be formed on the top surfaces of the first and second light emitting structures 10 and 20. Accordingly, a light extraction pattern may be provided on the top surfaces of the light emitting structures 10 and 20. A concave-convex pattern may be provided on the first and second light emitting structures 10 and 20. For example, the light extraction pattern provided on the first and second light emitting structures 10 and 20 may be formed through a PEC (Photo Electro Chemical) etching process. Therefore, according to the embodiment, the external light extraction effect can be increased.

Next, as shown in FIG. 6, the first electrode 80, the third electrode 85, and the first to third connection parts 90, 95 and 97 may be formed.

According to the embodiment, an electric power may be applied to the first light emitting structure 10 through the first and second electrodes 80 and 83. According to the embodiment, the first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au and Mo.

According to the embodiment, an electric power may be applied to the second light emitting structure 20 through the third and fourth electrodes 85 and 87. According to the embodiment, the third electrode 85 may comprise an ohmic layer, an intermediate layer, and an upper layer. The ohmic layer may comprise a material selected from the group consisting of Cr, V, W, Ti, and Zn, and may make ohmic contact. The intermediate layer may be implemented by using a material selected from the group consisting of Ni, Cu and Al. For example, the upper layer may comprise Au. The third electrode 85 may comprise at least one selected from the group consisting of Cr, V, W, Ti, Zn, Ni, Cu, Al, Au and Mo.

The light emitting device according to the embodiment may comprise the first to third connection parts 90, 95 and 97. The first connection part 90 may be electrically connected to the first electrode 80 and the conductive support member 70. The second connection part 95 may be electrically connected to the second and third electrodes 83 and 85. The third connection part 97 may be electrically connected to the fourth electrode 87. One end of the third connection part 97 may be provided on the channel layer 30. The third connection part 97 may be electrically connected to the second reflective layer 27.

The first connection part 90 may make contact with the first electrode 80. The first connection part 90 may be electrically connected to the third metal layer 50. The first connection part 90 may make contact with the third metal layer 50. The first connection part 90 may be electrically connected to the conductive support member 70 through the third metal layer 50 and the bonding layer 60.

The first connection part 90 may be provided through the insulating layer 40. The first connection part 90 may be electrically connected to the conductive support member 70 through the insulating layer 40. The first connection part 90 may be electrically connected to the third metal layer 50 through the channel layer 30. The first connection part 90 may be electrically connected to the third metal layer 50 through the channel layer 30 and the insulating layer 40.

The first connection part 90 may be provided at the lateral side of the first light emitting structure 10. The first connection part 90 may be provided at the lateral side of the first conductive first semiconductor layer 11. The first connection part 90 may make contact with the lateral side of the first conductive first semiconductor layer 11. The channel layer 30 may insulate the first connection part 90 from the first active layer 12. The channel layer 30 may insulate the first connection part 90 from the second conductive second semiconductor layer 13. The first connection part 90 may be spaced apart from the first active layer 12 by a distance of at least 3 μm.

The second connection part 95 may be provided at a lateral side of the second light emitting structure 20. The second connection part 95 may be provided at a lateral side of the first conductive third semiconductor layer 21. The second connection part 95 may make contact with the lateral side of the first conductive third semiconductor layer 21. The channel layer 30 may insulate the second connection part 95 from the second active layer 22. The channel layer 30 may insulate the second connection part 95 from the second conductive fourth semiconductor layer 23. The second connection part 95 may be spaced apart from the second active layer 22 by at least 3 μm.

The third connection part 97 may be electrically connected to the second metal layer 45. The third connection part 97 may make contact with the second metal layer 45. One end of the third connection part 97 may be provided on the channel layer 30. One end of the third connection part 97 may be spaced apart from a lateral side of the second light emitting structure 20. One end of the third connection part 97 may be exposed to the lateral side of the second light emitting structure 20.

The third connection part 97 may be electrically connected to the second metal layer 45 through the channel layer 30. In addition, the third connection part 97 may be electrically connected to the second metal layer 45 through the insulation layer 40. The third connection part 97 may be electrically connected to the fourth electrode 87. The third connection part 97 may make contact with the fourth electrode 87.

The first to third connection parts 90, 95 and 97 may comprise at least one of Cr, V, W, Ti, Zn, Ni, Pt, Cu, Al, Au and Mo.

According to the light emitting device of the embodiment, the second electrode 83 may be electrically connected to the first conductive first semiconductor layer 11 provided on the second electrode 83 through the conductive support member 70 provided under the second electrode 83. The second electrode 83 may be disposed between the second conductive second semiconductor layer 13 and the conductive support member 70.

Thus, an electric power may be provided to the first conductive first semiconductor layer 11 through a scheme of attaching the conductive support member 70 to a bonding pad. In addition, according to the embodiment, the second connection part 95 may be electrically connected to the second and third electrodes 83 and 85. The third connection part 97 may be electrically connected to the fourth electrode 87. Thus, by connecting the third connection part 97 to a power pad through a wire bonding scheme, an electric power may be supplied to the second conductive second semiconductor layer 13.

According to the light emitting device of the embodiment, an electric power may be supplied to the first and second light emitting structures 10 and 20 through the conductive support member 70 and the third connection part 97. Therefore, according to the embodiment, current concentration can be prevented, and the electrical reliability can be improved.

Meanwhile, the process of forming each layer described above is provided for the illustrative purpose, and the process sequence thereof may be variously modified.

Figure 7:
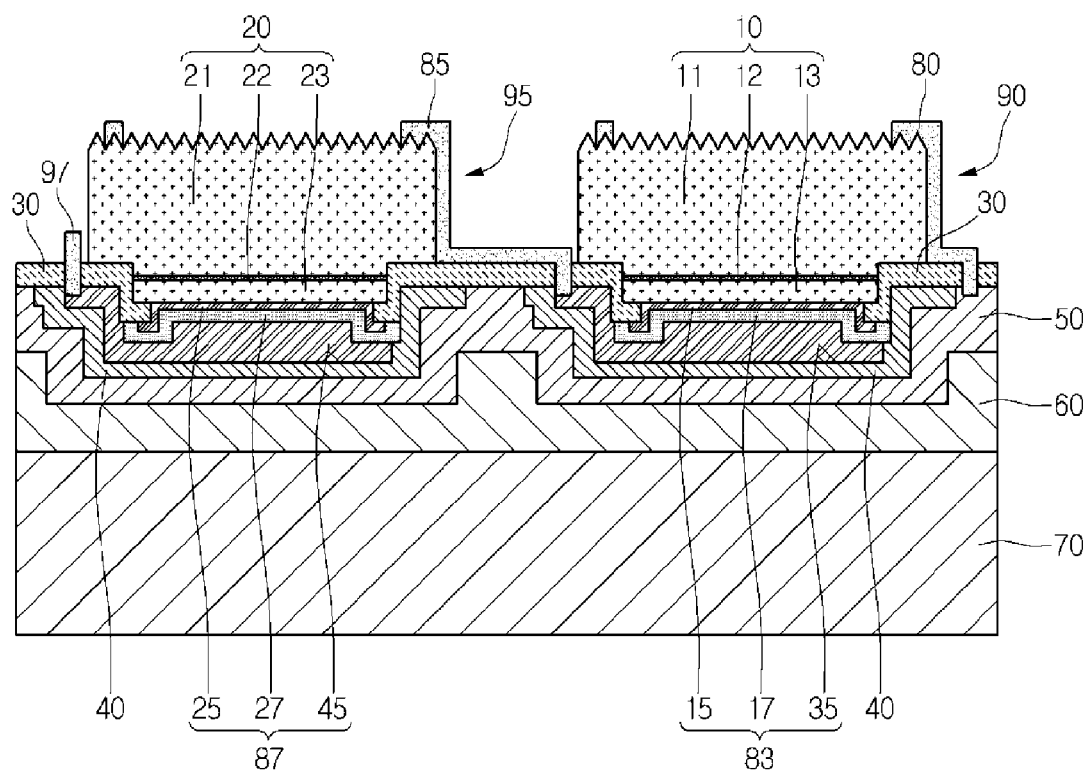
FIG. 7 is a sectional view showing another example of the light emitting device according to the embodiment.

FIG. 7 is a sectional view showing still another example of a light emitting device according to the embodiment. In the following description about the light emitting device shown in FIG. 7, components and structures the same as those described with reference to FIG. 1 will not be further described in order to avoid redundancy.

According to the embodiment shown in FIG. 7, the channel layer 30 may be provided at the peripheral portions of the lower portions of the first and second light emitting structures 10 and 20, and the insulating layer 40 may not be exposed to the peripheral portions of the lower portions of the first and second light emitting structures 10 and 20.

The light emitting device according to the embodiment may comprise the channel layer 30 provided at the peripheral portions of the lower portions of the first and second light emitting structures 10 and 20. For example, the top surface of the channel layer 30 may be provided higher than the top surface of the first active layer 12. The top surface of the channel layer 30 may be provided higher than the top surface of the second active layer 22.

The channel layer 30 may surround the first active layer 12. The channel layer 30 may surround a peripheral portion of the second conductive second semiconductor layer 13. One end of the channel layer 30 may be provided under the second conductive second semiconductor layer 13. The one end of the channel layer 30 may make contact with a bottom surface of the second conductive second semiconductor layer 13. The one end of the channel layer 30 may be disposed between the second conductive second semiconductor layer 13 and the second electrode 83. The one end of the channel layer 30 may be disposed between the second conductive second semiconductor layer 13 and a first reflective layer 17.

The channel layer 30 may surround the second active layer 22. The channel layer 30 may surround a peripheral portion of the second conductive fourth semiconductor layer 23. One end of the channel layer 30 may be provided under the second conductive fourth semiconductor layer 23. The one end of the channel layer 30 may make contact with a bottom surface of the second conductive fourth semiconductor layer 23. The one end of the channel layer 30 may be disposed between the second conductive fourth semiconductor layer 23 and the fourth electrode 87. The one end of the channel layer 30 may be disposed between the second conductive fourth semiconductor layer 23 and a second reflective layer 27.

For example, the channel layer 30 may be implemented by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the first and second light emitting structures 10 and 20 thereafter. In addition, through the isolation process, the electrical characteristic of the light emitting device can be prevented from being degraded.

According to the embodiment, power may be applied to the first light emitting structure 10 through the first and second electrodes 80 and 83. According to the embodiment, the first electrode 80 may comprise an ohmic layer, an intermediate layer and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

According to the embodiment, power may be applied to the second light emitting structure 20 through the third and fourth electrodes 85 and 87. According to the embodiment, the third electrode 85 may comprise an ohmic layer, an intermediate layer and an upper layer. The ohmic layer may comprise a material selected from the group consisting of Cr, V, W, Ti, and Zn, and may make ohmic contact. The intermediate layer may be implemented by using a material selected from the group consisting of Ni, Cu and Al. For example, the upper layer may comprise Au. The third electrode 85 may comprise at least one selected from the group consisting of Cr, V, W, Ti, Zn, Ni, Cu, Al, Au, and Mo.

The light emitting device according to the embodiment may comprise the first to third connection parts 90, 95 and 97. The first connection part 90 may be electrically connected to the first electrode 80 and the conductive support member 70. The second connection part 95 may be electrically connected to the second and third electrodes 83 and 85. The third connection part 97 may be electrically connected to the fourth electrodes 87. One end of the third connection part 97 may be provided over the channel layer 30. The third connection part 97 may be electrically connected to the second reflective layer 27.

The first connection part 90 may make contact with the first electrode 80. The first connection part 90 may be electrically connected to the third metal layer 50. The first connection part 90 may make contact with the third metal layer 50. The first connection part 90 may be electrically connected to the conductive support member 70 through the third metal layer 50 and the bonding layer 60. The first connection part 90 may make direct contact with the bonding layer 60 or the conductive support member 70.

The first connection part 90 may be provided through the insulating layer 40. The first connection part 90 may be electrically connected to the conductive support member 70 through the insulating layer 40. In addition, the first connection part 90 may be electrically connected to the third metal layer 50 through the channel layer 30. The first connection part 90 may be electrically connected to the third metal layer 50 through the channel layer 30 and the insulating layer 40.

The first connection part 90 may be provided at a lateral side of the first light emitting structure 10. The first connection part 90 may be provided at a lateral side of the first conductive first semiconductor layer 11. The first connection part 90 may make contact with the lateral side of the first conductive first semiconductor layer 11. The channel layer 30 may insulate the first connection part 90 from the first active layer 12. The channel layer 30 may insulate the first connection part 90 from the second conductive second semiconductor layer 13. The first connection part 90 may be spaced apart from the first active layer 12 by at least 3 µm.

The second connection part 95 may be provided at a lateral side of the second light emitting structure 20. The second connection part 95 may be provided at a lateral side of the first conductive third semiconductor layer 21. The second connection part 95 may make contact with the lateral side of the first conductive third semiconductor layer 21. The channel layer 30 may insulate the second connection part 95 from the second active layer 22. The channel layer 30 may insulate the second connection part 95 from the second conductive fourth semiconductor layer 23. The second connection part 95 may be spaced apart from the second active layer 22 by at least 3 µm.

The third connection part 97 may be electrically connected to the second metal layer 45. The third connection part 97 may make contact with the second metal layer 45. One end of the third connection part 97 may be provided on the channel layer 30. One end of the third connection part 97 may be spaced apart from a lateral side of the second light emitting structure 20. One end of the third connection part 97 may be exposed to the lateral side of the second light emitting structure 20.

The third connection part 97 may be electrically connected to the second metal layer 45 through the channel layer 30. In addition, the third connection part 97 may be electrically connected to the second metal layer 45 through the insulation layer 40. The third connection part 97 may be electrically connected to the fourth electrode 87. The third connection part 97 may make contact with the fourth electrode 87.

The first to third connection parts 90, 95 and 97 may comprise at least one of Cr, V, W, Ti, Zn, Ni, Pt, Cu, Al, Au and Mo.

According to the light emitting device of the embodiment, the second electrode 83 may be electrically connected to the first conductive first semiconductor layer 11 provided on the second electrode 83 through the conductive support member 70 provided under the second electrode 83. The second electrode 83 may be disposed between the second conductive second semiconductor layer 13 and the conductive support member 70.

Thus, an electric power may be provided to the first conductive first semiconductor layer 11 through a scheme of attaching the conductive support member 70 to a bonding pad. In addition, according to the embodiment, the second connection part 95 may be electrically connected to the second and third electrodes 83 and 85. The third connection part 97 may be electrically connected to the fourth electrode 87. Thus, by connecting the third connection part 97 to a power pad through a wire bonding scheme, an electric power may be supplied to the second conductive second semiconductor layer 13.

According to the light emitting device of the embodiment, an electric power may be supplied to the first and second light emitting structures 10 and 20 through the conductive support member 70 and the third connection part 97. Therefore, according to the embodiment, current concentration can be prevented, and the electrical reliability can be improved.

Figure 8:
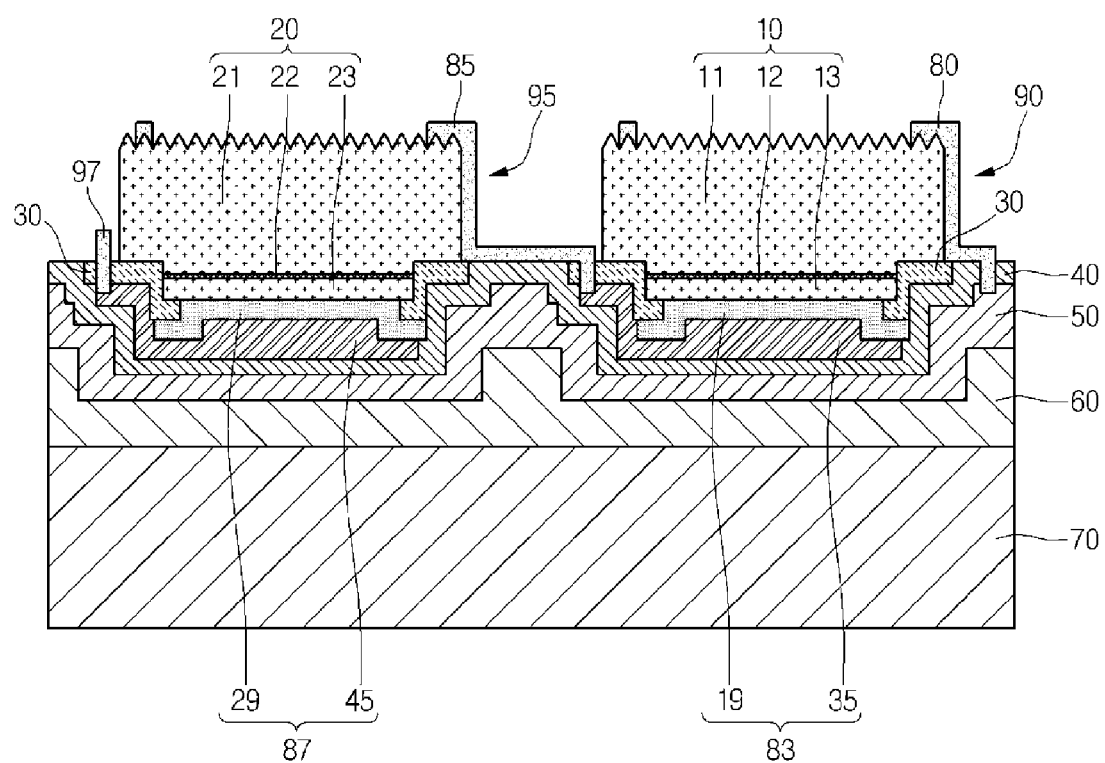
FIGS. 8 and 9 are sectional views showing modifications of the light emitting device according to the embodiment.

FIG. 8 is a sectional view showing another example of a light emitting device according to the embodiment. In the following description about the light emitting device shown in FIG. 8, components and structures the same as those described with reference to FIG. 1 will not be further described in order to avoid redundancy.

According to the light emitting device of the embodiment, a first ohmic reflective layer 19 may be provided under the first light emitting structure 10. The first ohmic reflective layer 19 may be implemented such that the first ohmic reflective layer 19 serve as both of the first reflective layer 17 and the first ohmic contact layer 15. Accordingly, the first ohmic reflective layer 19 may make ohmic contact with the second conductive second semiconductor layer 13, and reflect the light thereon from the first light emitting structure 10.

According to the light emitting device of the embodiment, a second ohmic reflective layer 29 may be provided under the second light emitting structure 20. The second ohmic reflective layer 29 may be implemented such that the second ohmic reflective layer 29 serve as both of the second reflective layer 27 and the second ohmic contact layer 25. Accordingly, the second ohmic reflective layer 29 may make ohmic contact with the second conductive fourth semiconductor layer 23, and reflect the light thereon from the second light emitting structure 20.

In this case, the first and second ohmic reflective layers 19 and 29 may comprise multiple layers. For example, the first and second ohmic reflective layers 19 and 29 may have a structure in which an Ag layer and a Ni layer are alternately formed, or may comprise a Ni/Ag/Ni layer, a Ti layer, or a Pt layer.

The light emitting device according to the embodiment may comprise a channel layer 30 provided at the peripheral portions of lower portions of the first and second light emitting structure 10 and 20. For example, the top surface of the channel layer 30 may be provided higher than the top surface of the first active layer 12. The top surface of the channel layer 30 may be provided higher than the top surface of the second active layer 22.

According to the embodiment, power may be applied to the first light emitting structure 10 through the first and second electrodes 80 and 83. According to the embodiment, the first electrode 80 may comprise an ohmic layer, an intermediate layer and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

According to the embodiment, an electric power may be applied to the second light emitting structure 20 through the third and fourth electrodes 85 and 87. According to the embodiment, the third electrode 85 may comprise an ohmic layer, an intermediate layer, and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The third electrode 85 may comprise at least one selected from the group consisting of Cr, V, W, Ti, Zn, Ni, Cu, Al, Au and Mo.

The light emitting device according to the embodiment may comprise the first to third connection parts 90, 95 and 97. The first connection part 90 may be electrically connected to the first electrode 80 and the conductive support member 70. The second connection part 95 may be electrically connected to the second and third electrodes 83 and 85. The third connection part 97 may be electrically connected to the fourth electrodes 87. One end of the third connection part 97 may be provided over the channel layer 30. The third connection part 97 may be electrically connected to the second reflective layer 27.

The first connection part 90 may make contact with the first electrode 80. The first connection part 90 may be electrically connected to the third metal layer 50. The first connection part 90 may make contact with the third metal layer 50. The first connection part 90 may be electrically connected to the conductive support member 70 through the third metal layer 50 and the bonding layer 60. The first connection part 90 may make direct contact with the bonding layer 60 or the conductive support member 70.

The first connection part 90 may be provided through the insulating layer 40. The first connection part 90 may be electrically connected to the conductive support member 70 through the insulating layer 40. In addition, the first connection part 90 may be electrically connected to the third metal layer 50 through the channel layer 30. The first connection part 90 may be electrically connected to the third metal layer 50 through the channel layer 30 and the insulating layer 40.

The first connection part 90 may be provided at a lateral side of the first light emitting structure 10. The first connection part 90 may be provided at a lateral side of the first conductive first semiconductor layer 11. The first connection part 90 may make contact with the lateral side of the first conductive first semiconductor layer 11. The channel layer 30 may insulate the first connection part 90 from the first active layer 12. The channel layer 30 may insulate the first connection part 90 from the second conductive second semiconductor layer 13. The first connection part 90 may be spaced apart from the first active layer 12 by at least 3 µm.

The second connection part 95 may be provided at a lateral side of the second light emitting structure 20. The second connection part 95 may be provided at a lateral side of the first conductive third semiconductor layer 21. The second connection part 95 may make contact with the lateral side of the first conductive third semiconductor layer 21. The channel layer 30 may insulate the second connection part 95 from the second active layer 22. The channel layer 30 may insulate the second connection part 95 from the second conductive fourth semiconductor layer 23. The second connection part 95 may be spaced apart from the second active layer 22 by at least 3 µm.

The third connection part 97 may be electrically connected to the second metal layer 45. The third connection part 97 may make contact with the second metal layer 45. One end of the third connection part 97 may be provided on the channel layer 30. One end of the third connection part 97 may be spaced apart from a lateral side of the second light emitting structure 20. One end of the third connection part 97 may be exposed to the lateral side of the second light emitting structure 20.

The third connection part 97 may be electrically connected to the second metal layer 45 through the channel layer 30. In addition, the third connection part 97 may be electrically connected to the second metal layer 45 through the insulation layer 40. The third connection part 97 may be electrically connected to the fourth electrode 87. The third connection part 97 may make contact with the fourth electrode 87.

The first to third connection parts 90, 95 and 97 may comprise at least one of Cr, V, W, Ti, Zn, Ni, Pt, Cu, Al, Au and Mo.

According to the light emitting device of the embodiment, the second electrode 83 may be electrically connected to the first conductive first semiconductor layer 11 provided on the second electrode 83 through the conductive support member 70 provided under the second electrode 83. The second electrode 83 may be disposed between the second conductive second semiconductor layer 13 and the conductive support member 70.

Thus, an electric power may be provided to the first conductive first semiconductor layer 11 through a scheme of attaching the conductive support member 70 to a bonding pad. In addition, according to the embodiment, the second connection part 95 may be electrically connected to the second and third electrodes 83 and 85. The third connection part 97 may be electrically connected to the fourth electrode 87. Thus, by connecting the third connection part 97 to a power pad through a wire bonding scheme, an electric power may be supplied to the second conductive second semiconductor layer 13.

According to the light emitting device of the embodiment, an electric power may be supplied to the first and second light emitting structures 10 and 20 through the conductive support member 70 and the third connection part 97. Therefore, according to the embodiment, current concentration can be prevented, and the electrical reliability can be improved.

Figure 9:
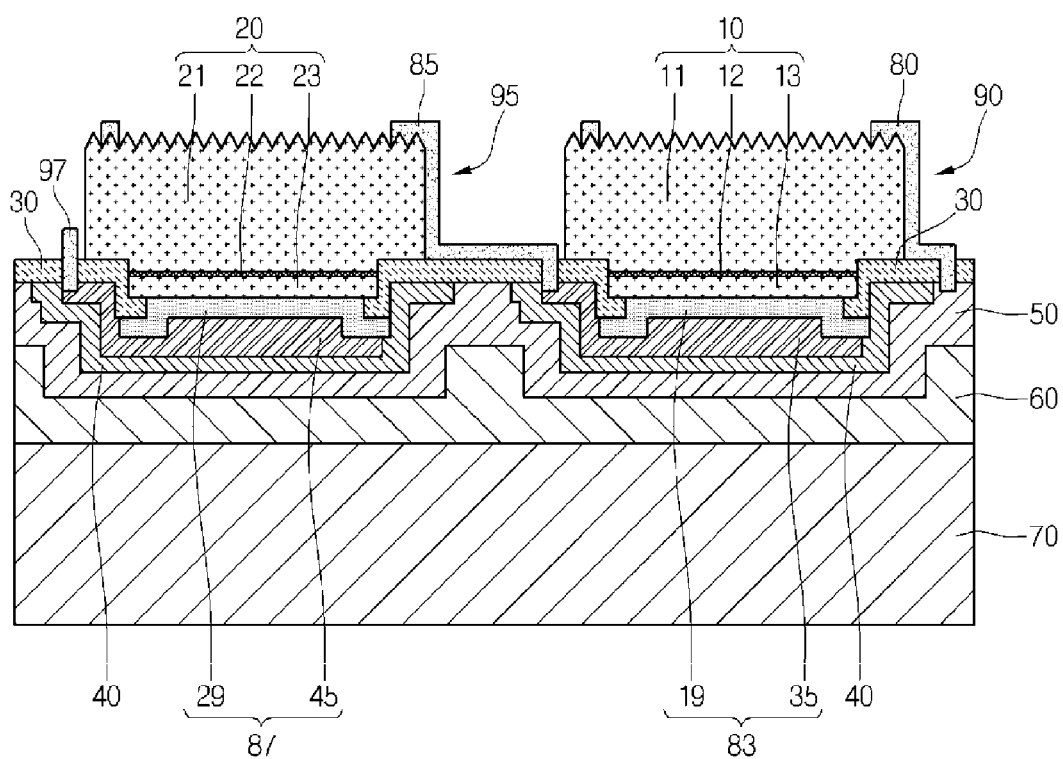

FIG. 9 is a sectional view showing still another example of a light emitting device according to the embodiment. In the following description about the light emitting device shown in FIG. 9, components and structures the same as those described with reference to FIG. 1 will not be further described in order to avoid redundancy.

According to the light emitting device of the embodiment, a first ohmic reflective layer 19 may be provided under the first light emitting structure 10. The first ohmic reflective layer 19 may be implemented such that the first ohmic reflective layer 19 serve as both of the first reflective layer 17 and the first ohmic contact layer 15. Accordingly, the first ohmic reflective layer 19 may make ohmic contact with the second conductive second semiconductor layer 13, and reflect the light thereon from the first light emitting structure 10.

According to the light emitting device of the embodiment, a second ohmic reflective layer 29 may be provided under the second light emitting structure 20. The second ohmic reflective layer 29 may be implemented such that the second ohmic reflective layer 29 serve as both of the second reflective layer 27 and the second ohmic contact layer 25. Accordingly, the second ohmic reflective layer 29 may make ohmic contact with the second conductive fourth semiconductor layer 23, and reflect the light thereon from the second light emitting structure 20.

In this case, the first and second ohmic reflective layers 19 and 29 may comprise multiple layers. For example, the first and second ohmic reflective layers 19 and 29 may have a structure in which an Ag layer and an Ni layer are alternately formed, or may comprise a Ni/Ag/Ni layer, a Ti layer, or a Pt layer.

The light emitting device according to the embodiment may comprise a channel layer 30 provided at the peripheral portions of lower portions of the first and second light emitting structure 10 and 20. For example, the top surface of the channel layer 30 may be provided higher than the top surface of the first active layer 12. The top surface of the channel layer 30 may be provided higher than the top surface of the second active layer 22.

According to the embodiment, power may be applied to the first light emitting structure 10 through the first and second electrodes 80 and 83. According to the embodiment, the first electrode 80 may comprise an ohmic layer, an intermediate layer and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

According to the embodiment, an electric power may be applied to the second light emitting structure 20 through the third and fourth electrodes 85 and 87. According to the embodiment, the third electrode 85 may comprise an ohmic layer, an intermediate layer, and an upper layer. The ohmic layer may comprise a material selected from the group consisting of Cr, V, W, Ti, and Zn, and may make ohmic contact. The intermediate layer may be implemented by using a material selected from the group consisting of Ni, Cu, and Al. For example, the upper layer may comprise Au. The third electrode 85 may comprise at least one selected from the group consisting of Cr, V, W, Ti, Zn, Ni, Cu, Al, Au and Mo.

The light emitting device according to the embodiment may comprise the first to third connection parts 90, 95 and 97. The first connection part 90 may be electrically connected to the first electrode 80 and the conductive support member 70. The second connection part 95 may be electrically connected to the second and third electrodes 83 and 85. The third connection part 97 may be electrically connected to the fourth electrodes 87. One end of the third connection part 97 may be provided over the channel layer 30. The third connection part 97 may be electrically connected to the second reflective layer 27.

The first connection part 90 may make contact with the first electrode 80. The first connection part 90 may be electrically connected to the third metal layer 50. The first connection part 90 may make contact with the third metal layer 50. The first connection part 90 may be electrically connected to the conductive support member 70 through the third metal layer 50 and the bonding layer 60. The first connection part 90 may make direct contact with the bonding layer 60 or the conductive support member 70.

The first connection part 90 may be provided through the insulating layer 40. The first connection part 90 may be electrically connected to the conductive support member 70 through the insulating layer 40. In addition, the first connection part 90 may be electrically connected to the third metal layer 50 through the channel layer 30. The first connection part 90 may be electrically connected to the third metal layer 50 through the channel layer 30 and the insulating layer 40.

The first connection part 90 may be provided at a lateral side of the first light emitting structure 10. The first connection part 90 may be provided at a lateral side of the first conductive first semiconductor layer 11. The first connection part 90 may make contact with the lateral side of the first conductive first semiconductor layer 11. The channel layer 30 may insulate the first connection part 90 from the first active layer 12. The channel layer 30 may insulate the first connection part 90 from the second conductive second semiconductor layer 13. The first connection part 90 may be spaced apart from the first active layer 12 by at least 3 μm.

The second connection part 95 may be provided at a lateral side of the second light emitting structure 20. The second connection part 95 may be provided at a lateral side of the first conductive third semiconductor layer 21. The second connection part 95 may make contact with the lateral side of the first conductive third semiconductor layer 21. The channel layer 30 may insulate the second connection part 95 from the second active layer 22. The channel layer 30 may insulate the second connection part 95 from the second conductive fourth semiconductor layer 23. The second connection part 95 may be spaced apart from the second active layer 22 by at least 3 μm.

The third connection part 97 may be electrically connected to the second metal layer 45. The third connection part 97 may make contact with the second metal layer 45. One end of the third connection part 97 may be provided on the channel layer 30. One end of the third connection part 97 may be spaced apart from a lateral side of the second light emitting structure 20. One end of the third connection part 97 may be exposed to the lateral side of the second light emitting structure 20.

The third connection part 97 may be electrically connected to the second metal layer 45 through the channel layer 30. In addition, the third connection part 97 may be electrically connected to the second metal layer 45 through the insulation layer 40. The third connection part 97 may be electrically connected to the fourth electrode 87. The third connection part 97 may make contact with the fourth electrode 87.

The first to third connection parts 90, 95 and 97 may comprise at least one of Cr, V, W, Ti, Zn, Ni, Pt, Cu, Al, Au and Mo.

According to the light emitting device of the embodiment, the second electrode 83 may be electrically connected to the first conductive first semiconductor layer 11 provided on the second electrode 83 through the conductive support member 70 provided under the second electrode 83. The second electrode 83 may be disposed between the second conductive second semiconductor layer 13 and the conductive support member 70.

Thus, an electric power may be provided to the first conductive first semiconductor layer 11 through a scheme of attaching the conductive support member 70 to a bonding pad. In addition, according to the embodiment, the second connection part 95 may be electrically connected to the second and third electrodes 83 and 85. The third connection part 97 may be electrically connected to the fourth electrode 87.

Thus, by connecting the third connection part 97 to a power pad through a wire bonding scheme, an electric power may be supplied to the second conductive second semiconductor layer 13.

According to the light emitting device of the embodiment, an electric power may be supplied to the first and second light emitting structures 10 and 20 through the conductive support member 70 and the third connection part 97. Therefore, according to the embodiment, current concentration can be prevented, and the electrical reliability can be improved.

Figure 10:
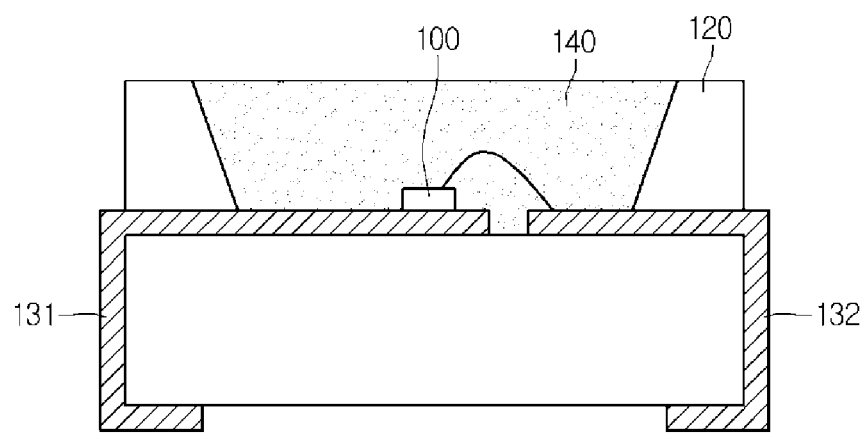
FIG. 10 is a view showing a light emitting device package according to the embodiment.

FIG. 10 is a sectional view showing a light emitting device package to which the light emitting device according to the embodiment is applied.

Referring to FIG. 10, the light emitting device package according to the embodiment comprises a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100.

The body 120 may comprise silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may comprise phosphors to change the wavelength of the light emitted from the light emitting device 100.

A plurality of light emitting device or light emitting device packages according to the embodiment may be arrayed on a board, and an optical member comprising a lens, a light guide plate, a prism sheet, or a diffusion sheet may be provided on the optical path of the light emitted from the light emitting device package. The light emitting device package, the board, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can comprise a light emitting device, or a light emitting device package according to the embodiment. For example, the lighting apparatus may comprise a lamp, a signal lamp, an electric sign board and a headlight of a vehicle.

Figure 12:
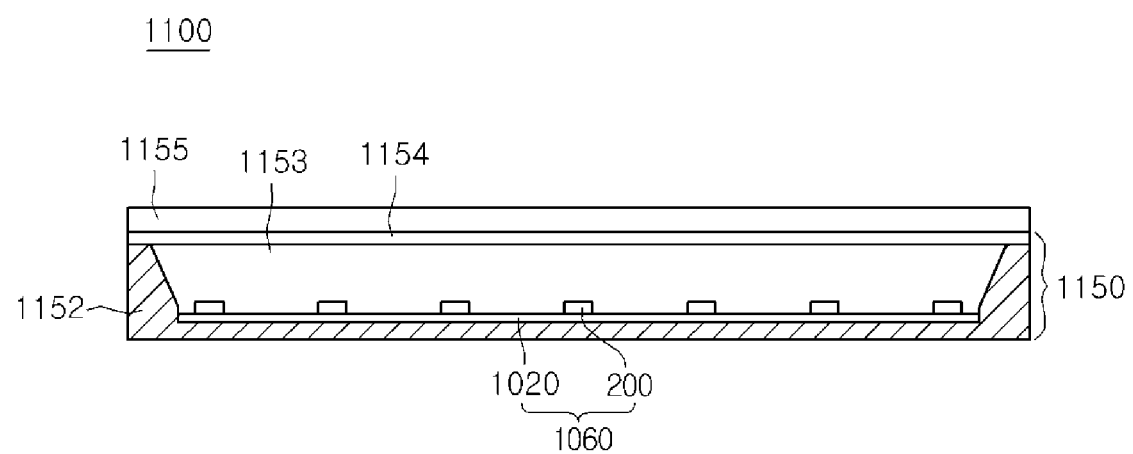
FIG. 12 is a view showing another example of the display device according to the embodiment.
Figure 13:
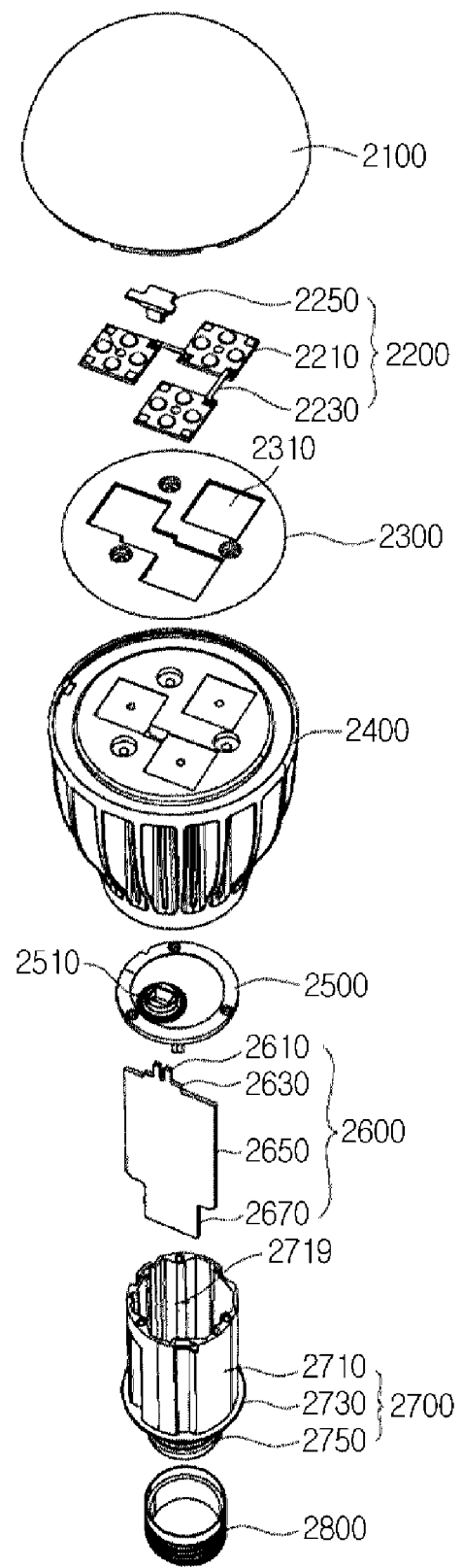
FIG. 13 is a view showing a light unit according to the embodiment.

The light emitting device according to the embodiment may be applied to the light unit. The light unit has a structure in which a plurality of light emitting devices are arrayed. The light unit may comprise a display device as shown in FIGS. 11 and 12 and the lighting apparatus as shown in FIG. 13.

Figure 11:
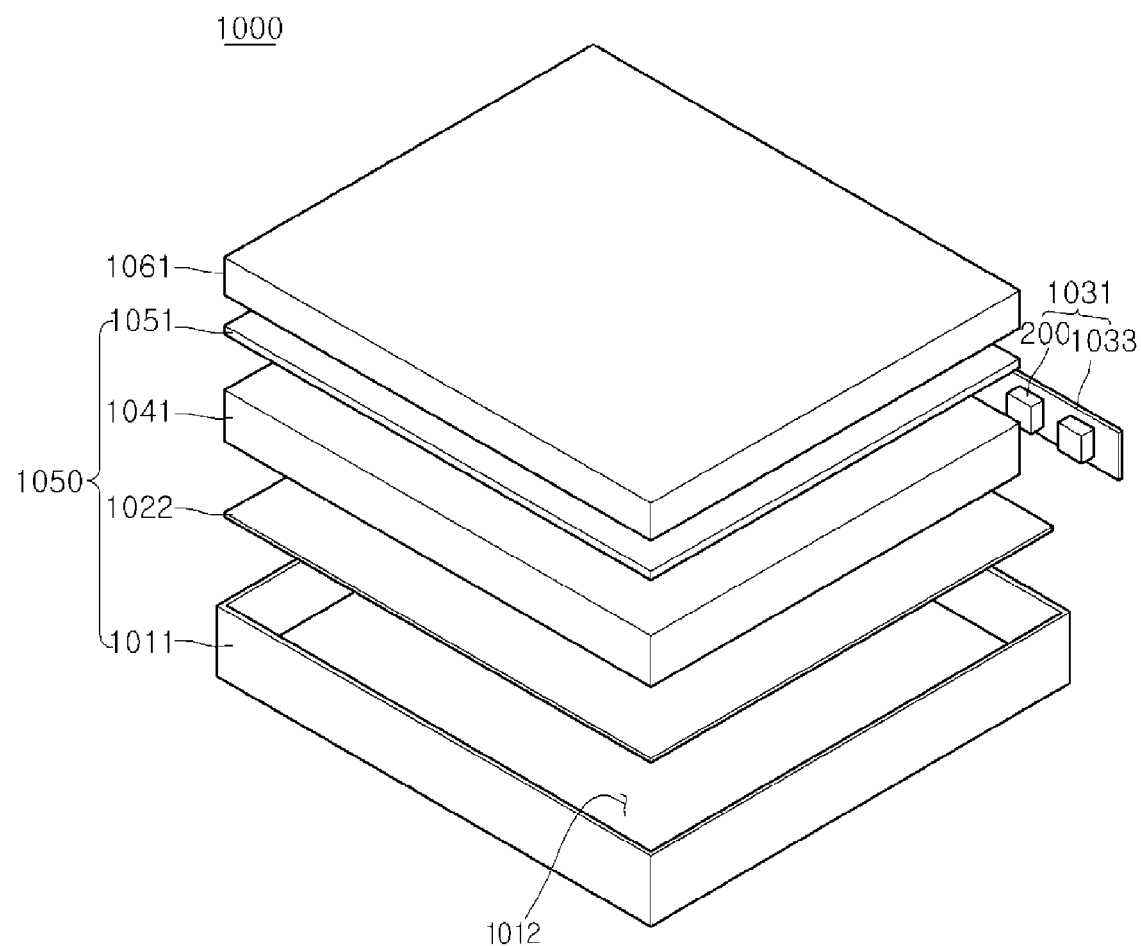
FIG. 11 is a view showing a display device according to the embodiment.

Referring to FIG. 11, a display device 1000 according to the embodiment comprises a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may comprise transparent material. For example, the light guide plate 1041 may comprise one of acryl-based resin such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may comprise a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) comprising a circuit pattern. In addition, the board 1033 may also comprise a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for example, is an LCD panel comprising first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and comprises at least one transmissive sheet. For example, the optical sheet 1051 comprises at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 12 is a sectional view showing another example of a display device according to the embodiment.

Referring to FIG. 12, the display device 1100 comprises a bottom cover 1152, a board 1020 on which the light emitting devices 100 are arrayed, an optical member 1154, and a display panel 1155.

The board 1020 and the light emitting devices 100 may constitute a light emitting module 1060. In addition, the bottom cover 1152, at least one light emitting module 1060, and the optical member 1154 may constitute the light unit.

The bottom cover 1152 can be provided therein with a receiving section 1153, but the embodiment is not limited thereto.

In this case, the optical member 1154 may comprise at least one of a lens, a light guide plate, a diffusion sheet, horizontal and vertical prism sheets, and a brightness enhanced sheet. The light guide plate may comprise PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 13 is a perspective view showing a lighting apparatus according to the embodiment.

Referring to FIG. 13, the lighting apparatus according to the embodiment may comprise a cover 2100, a light source module 2200, a radiator 2400, a power supply part 2600, an inner case 2700, and a socket 2800. The lighting apparatus according to the embodiment may further comprise at least one of a member 2300 and a holder 2500. The light source module 2200 may comprise the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may comprise a coupling part which is coupled with the radiator 2400.

The cover 2100 may comprise an inner surface coated with a milk-white pigment. The milk-white pigment may comprise a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may comprise glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may comprise a light source 2210, a connection plate 2230, and a connector 2250.

The member 2300 is disposed on a top surface of the radiator 2400, and comprises guide recesses 2310 into which a plurality of light sources 2210 and the connector 2250 are inserted. The guide recesses 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may comprise an insulating material. The connection plate 2230 of the light source module 2200 may comprise an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving recess 2719 of an insulating part 2710 of an inner case 2700. Accordingly, the power supply part 2600 received in the insulating part 2710 of the inner case 2700 is sealed. The holder 2500 comprises a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving recess 2719 of the inner case 2700, and is sealed inside the inner case 2700 by the holder 2500.

The power supply part 2600 may comprise a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may comprise a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may comprise a molding part therein together with the power supply part 2600. The molding part is prepared by hardening molding liquid, and the power supply part 2600 may be fixed inside the inner case 2700 by the molding part.

The embodiment provides a light emitting device capable of preventing current concentration while improving electrical reliability, a light emitting device package, and a light unit.

A light emitting device according to the embodiment includes a conductive support member; a first light emitting structure on the conductive support member, the first light emitting structure comprising a first conductive first semiconductor layer, a first active layer under the first conductive first semiconductor layer, and a second conductive second semiconductor layer under the first active layer; a second light emitting structure on the conductive support member, the second light emitting structure comprising a first conductive third semiconductor layer, a second active layer under the first conductive third semiconductor layer, and a second conductive fourth semiconductor layer under the second active layer; a channel layer around lower portions of the first and second light emitting structures; a first electrode electrically connected to the first conductive first semiconductor layer; a second electrode electrically connected to the second conductive second semiconductor layer; a third electrode electrically connected to the first conductive third semiconductor layer; a fourth electrode electrically connected to the second conductive fourth semiconductor layer; a first connection part electrically connected to the first electrode and the conductive support member; a second connection part electrically connected to the second and third electrodes; and a third connection part electrically connected to the fourth electrode and having one end provided on the channel layer.

A light emitting device according to the embodiment comprises a conductive support member; a first light emitting structure comprising a first conductive first semiconductor layer, a first active layer under the first conductive first semiconductor layer, and a second conductive second semiconductor layer under the first active layer; a second light emitting structure on the conductive support member, the second light emitting structure comprising a first conductive third semiconductor layer, a second active layer under the first conductive third semiconductor layer, and a second conductive fourth semiconductor layer under the second active layer; a channel layer around lower portions of the first and second light emitting structures; a first electrode electrically connected to the first conductive first semiconductor layer; a second electrode electrically connected to the second conductive second semiconductor layer; a third electrode electrically connected to the first conductive third semiconductor layer; a fourth electrode electrically connected to the second conductive fourth semiconductor layer; a first connection part electrically connected to the first electrode and the conductive support member; a second connection part electrically connected to the second and third electrodes; and a third connection part electrically connected to the fourth electrode and having one end provided on the channel layer, wherein the first connection part makes contact with a lateral side of first conductive first semiconductor layer, the second connection part makes contact with a lateral side of the first conductive third semiconductor layer, and one end of the third connection part is spaced apart from a lateral side of the second light emitting structure and exposed to a lateral side of the second light emitting structure.

A light emitting device according to the embodiment comprises a conductive support member; a first light emitting structure comprising a first conductive first semiconductor layer, a first active layer under the first conductive first semiconductor layer, and a second conductive second semiconductor layer under the first active layer; a second light emitting structure on the conductive support member, the second light emitting structure comprising a first conductive third semiconductor layer, a second active layer under the first conductive third semiconductor layer, and a second conductive fourth semiconductor layer under the second active layer; a channel layer around lower portions of the first and second light emitting structures; a first electrode electrically connected to the first conductive first semiconductor layer; a second electrode electrically connected to the second conductive second semiconductor layer; a third electrode electrically connected to the first conductive third semiconductor layer; a fourth electrode electrically connected to the second conductive fourth semiconductor layer; a first connection part electrically connected to the first electrode and the conductive support member; a second connection part electrically connected to the second and third electrodes; and a third connection part electrically connected to the fourth electrode and having one end provided on the channel layer, wherein a top surface of the channel layer is higher than top surfaces of the first and second active layers, and the channel layer surrounds the first and second active layers.

The embodiment provides a light emitting device capable of preventing current concentration while improving electrical reliability, a light emitting device package, and a light unit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support member;
a first light emitting structure provided over the conductive support member, the first light emitting structure comprising a first conductive first semiconductor layer, a first active layer under the first conductive first semiconductor layer, and a second conductive second semiconductor layer adjacent to the first active layer;
a second light emitting structure provided over the conductive support member, the second light emitting structure comprising a first conductive third semiconductor layer, a second active layer under the first conductive third semiconductor layer, and a second conductive fourth semiconductor layer adjacent to the second active layer;
a channel layer around lower portions of the first and second light emitting structures;
a first electrode coupled to the first conductive first semiconductor layer;
a second electrode coupled to the second conductive second semiconductor layer;
a third electrode coupled to the first conductive third semiconductor layer;
a fourth electrode coupled to the second conductive fourth semiconductor layer;
a first connection part coupled to the first electrode and the conductive support member;
a second connection part coupled to the second and third electrodes; and
a third connection part coupled to the fourth electrode and having one end provided on the channel layer.

2. The light emitting device of claim 1, wherein the first electrode is provided on the first conductive first semiconductor layer.

3. The light emitting device of claim 1, wherein the second electrode is disposed between the second conductive second semiconductor layer and the conductive support member.

4. The light emitting device of claim 3, wherein the second electrode comprises at least one of an ohmic contact layer, a reflective layer, or a metal layer.

5. The light emitting device of claim 1, wherein the third electrode is provided on the first conductive third semiconductor layer.

6. The light emitting device of claim 1, wherein the fourth electrode is disposed between the second conductive fourth semiconductor layer and the conductive support member.

7. The light emitting device of claim 6, wherein the fourth electrode comprises at least one of an ohmic contact layer, a reflective layer, or a metal layer.

8. The light emitting device of claim 1, wherein one end of the third connection part is spaced apart from a lateral side of the second light emitting structure and exposed to the lateral side of the second light emitting structure.

9. The light emitting device of claim 1, wherein a top surface of the channel layer is higher than top surfaces of the first and second active layers.

10. The light emitting device of claim 1, further comprising an insulating layer provided between the second electrode and the conductive support member and between the fourth electrode and the conductive support member.

11. The light emitting device of claim 10, wherein a top surface of the insulating layer is exposed to a periphery of a bottom portion of the second light emitting structure.

12. The light emitting device of claim 10, wherein the insulating layer surrounds a periphery of the channel layer.

13. The light emitting device of claim 1, wherein the first connection part makes contact with a lateral side of the first conductive first semiconductor layer.

14. The light emitting device of claim 1, wherein the first connection part is electrically connected to the conductive support member by passing through the channel layer.

15. The light emitting device of claim 1, wherein the second connection part makes contact with a lateral side of the first conductive third semiconductor layer.

16. The light emitting device of claim 1, wherein the channel layer surrounds peripheries of the first and second active layers.

17. The light emitting device of claim 1, wherein the channel layer surrounds peripheries of the second conductive second semiconductor layer and the second conductive fourth semiconductor layer.

18. The light emitting device of claim 1, further comprising a roughness on the first and second light emitting structures.

19. A light emitting device comprising:
a conductive support member;
a first light emitting structure comprising a first semiconductor layer of a first conductivity type, a first active layer provided over the first semiconductor layer, and a second semiconductor layer of a second conductivity type under the first active layer;
a second light emitting structure provided over the conductive support member, the second light emitting structure comprising a third semiconductor layer of the first conductivity type, a second active layer under the first conductive third semiconductor layer, and a fourth semiconductor layer of the second conductivity type under the second active layer;
a channel layer around lower portions of the first and second light emitting structures;
a first electrode electrically connected to the first semiconductor layer;
a second electrode electrically connected to the second semiconductor layer;
a third electrode electrically connected to the third semiconductor layer;
a fourth electrode electrically connected to the fourth semiconductor layer;
a first connection part electrically connected to the first electrode and the conductive support member;
a second connection part electrically connected to the second and third electrodes; and
a third connection part electrically connected to the fourth electrode and having one end provided on the channel layer,
wherein the first connection part makes contact with a lateral side of the first semiconductor layer,
wherein the second connection part makes contact with a lateral side of the third semiconductor layer, and
wherein one end of the third connection part is spaced apart from a lateral side of the second light emitting structure and exposed to a lateral side of the second light emitting structure.

20. A light emitting device comprising:
a conductive support member;
a first light emitting structure comprising a first conductive first semiconductor layer, a first active layer under the first conductive first semiconductor layer, and a second conductive second semiconductor layer under the first active layer;
a second light emitting structure on the conductive support member, the second light emitting structure comprising a first conductive third semiconductor layer, a second active layer under the first conductive third semiconductor layer, and a second conductive fourth semiconductor layer under the second active layer;
a channel layer around lower portions of the first and second light emitting structures;
a first electrode electrically connected to the first conductive first semiconductor layer;
a second electrode electrically connected to the second conductive second semiconductor layer;
a third electrode electrically connected to the first conductive third semiconductor layer;
a fourth electrode electrically connected to the second conductive fourth semiconductor layer;
a first connection part electrically connected to the first electrode and the conductive support member;
a second connection part electrically connected to the second and third electrodes; and
a third connection part electrically connected to the fourth electrode and having one end provided on the channel layer,
wherein a top surface of the channel layer is higher than top surfaces of the first and second active layers, and
wherein the channel layer surrounds the first and second active layers.

* * * * *